(12) United States Patent
Pyo (10) Patent No.: US 8,208,327 B2
(45) Date of Patent: Jun. 26, 2012

(54) SEMICONDUCTOR MEMORY DEVICE AND DATA READ METHOD THEREOF

(75) Inventor: Suk-Soo Pyo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 12/794,033

(22) Filed: Jun. 4, 2010

(65) Prior Publication Data

US 2011/0080795 A1 Apr. 7, 2011

(30) Foreign Application Priority Data

Oct. 1, 2009 (KR) .................. 10-2009-0093751

(51) Int. Cl.
*G11C 7/00* (2006.01)
*G11C 7/02* (2006.01)
(52) U.S. Cl. ..................................... 365/203; 365/207
(58) Field of Classification Search .............. 365/203, 365/207
See application file for complete search history.

(56) References Cited

U.S. PATENT DOCUMENTS

| | | | | |
|---|---|---|---|---|
| 5,291,450 A | * | 3/1994 | Fujiwara et al. | ............... 365/203 |
| 5,323,349 A | * | 6/1994 | Hamade et al. | ............... 365/207 |
| 7,031,213 B2 | | 4/2006 | Noh | |
| 7,193,912 B2 | | 3/2007 | Obara et al. | |
| 7,440,350 B2 | | 10/2008 | Obara et al. | |
| 2004/0136251 A1 | * | 7/2004 | Mizuno et al. | ............... 365/203 |
| 2005/0024965 A1 | * | 2/2005 | Nakamura | ............... 365/207 |
| 2007/0242543 A1 | | 10/2007 | Romanovskyy et al. | |

FOREIGN PATENT DOCUMENTS

| KR | 10-0251224 B1 | 1/2000 |
|---|---|---|
| KR | 10-2005-0023537 A | 3/2005 |
| KR | 10-2006-0048072 A | 5/2006 |

* cited by examiner

*Primary Examiner* — Anh Phung
(74) *Attorney, Agent, or Firm* — Lee & Morse, P.C.

(57) ABSTRACT

A semiconductor memory device includes a first bitline pair equalized to a first voltage level by a first equalizer circuit, a second bitline pair equalized to a second voltage level by a second equalizer circuit, an isolation circuit disposed between the first bitline pair and the second bitline pair, the isolation unit configured to electrically connect or isolate the first bitline pair to or from the second bitline pair, and a sense amplifier electrically connected to the second bitline pair, the sense amplifier configured to sense a voltage difference of the second bitline pair, wherein the isolation circuit isolates one of the connections between the first bitline pair and the second bitline pair while the sense amplifier senses the voltage difference of the second bitline pair.

18 Claims, 9 Drawing Sheets

SEMICONDUCTOR MEMORY DEVICE AND DATA READ METHOD THEREOF

BACKGROUND

1. Field

Embodiments relate to a semiconductor memory device and a data read method thereof.

2. Description of Related Art

A semiconductor memory device is a memory device that is capable of storing data and retrieving target data by reading stored data, if necessary. Semiconductor memory devices may be classified as random access memory (RAM) and read only memory (ROM). RAM is a volatile memory that loses stored data when power is interrupted, while ROM is a non-volatile memory that holds stored data even when power is interrupted. RAM includes dynamic RAM (DRAM) and static RAM (SRAM). ROM includes programmable ROM (PROM), erasable PROM (EPROM), electrically EPROM (EEPROM), and flash memory. In a DRAM, a memory cell array is connected to a bitline BL and a complementary bitline BLB (BL bar) having an inverted signal of the bitline BL.

SUMMARY

It is a feature of an embodiment to provide a semiconductor memory device sensing and amplifying a voltage difference on a bitline pair and a data read method thereof.

At least one of the above and other features and advantages may be realized by providing a semiconductor memory device, including a first bitline pair equalized to a first voltage level by a first equalizer circuit, a second bitline pair equalized to a second voltage level by a second equalizer circuit, an isolation circuit disposed between the first bitline pair and the second bitline pair, the isolation unit configured to electrically connect or isolate the first bitline pair to or from the second bitline pair, and a sense amplifier electrically connected to the second bitline pair, the sense amplifier configured to sense a voltage difference of the second bitline pair. The isolation circuit may isolate one of the connections between the first bitline pair and the second bitline pair while the sense amplifier senses the voltage difference of the second bitline pair.

The isolation circuit may electrically connect the first bitline pair to the second bitline pair before the sense amplifier senses the voltage difference of the second bitline pair.

The isolation circuit may include a first circuit unit coupled to the first bitline pair, the first circuit unit configured to electrically connect or isolate the first bitline pair to or from the second bit line pair, and a second circuit unit coupled to the second bitline pair, the second circuit unit configured to electrically connect or isolate the first bitline pair to or from the second bitline pair. Before the sense amplifier senses the voltage difference of the second bitline pair, the first circuit unit and the second circuit unit may electrically connect the first bitline pair to the second bitline pair.

While the sense amplifier senses the voltage difference of the second bitline pair, the second circuit unit may isolate one of the connections of the first bitline pair and the second bitline pair.

The first circuit unit may include a first transistor coupled a main bitline of the first bitline pair, the first transistor configured to form a current path in response to a pre-sensing signal, and a second transistor coupled a reference bitline of the first bitline pair, the second transistor configured to form a current path in response to the pre-sensing signal.

The second circuit unit may include a third transistor coupled to a main bitline of the second bitline pair, the third transistor configured to form a current path in response to a voltage at a reference bitline of the second bitline pair, and a fourth transistor coupled to the reference bitline of the second bitline pair, the fourth transistor configured to form a current path in response to a voltage at the main bitline of the second bitline pair.

While the sense amplifier senses the voltage difference of the second bitline pair, a connected bitline of the first bitline pair and the second bitline pair may have a ground voltage level.

The isolation circuit may further include a third circuit unit connected to the first bitline pair, the third circuit unit configured to provide the second voltage level to the first bitline pair.

During a restore operation, the third circuit unit may provide the second voltage level to a bitline of the first bitline pair isolated by the second circuit unit.

The third circuit unit may include a fifth transistor coupled between a main bitline of the first bitline pair and a node, the fifth transistor configured to form a current path in response to a voltage at a reference bitline of the second bitline pair, a sixth transistor coupled between a reference bitline of the first bitline pair and the node, the sixth transistor configured to form a current path in response to a voltage at a main bitline of the second bitline pair, and a seventh transistor connected to the node and configured to provide the second voltage level to the main bitline of the first bitline pair or the reference bitline of the first bitline pair.

At least one of the above and other features and advantages may also be realized by providing a sensing and equalizing circuit configured to sense a voltage difference of a bitline pair to read out data, the sensing and equalizing circuit including a first bitline pair equalized to a first voltage level by a first equalizer circuit, a second bitline pair equalized to a second voltage level by a second equalizer circuit, an isolation circuit disposed between the first bitline pair and the second bitline pair, the isolation circuit configured to electrically connect or isolate the first bitline pair to or from the second bitline pair, and a sense amplifier electrically connected to the second bitline, the sense amplifier configured to sense a voltage difference of the second bitline pair. The isolation circuit may include a first transistor coupled between a main bitline of the first bitline pair and a first node, the first transistor configured to form a current path in response to a pre-sensing signal, a second transistor coupled between a reference bitline of the first bitline pair and a second node, the second transistor configured to form a current path in response to the pre-sensing signal, a third transistor coupled between a main bitline of the second bitline pair and the first node, the third transistor configured to form a current path in response to a voltage at a reference bitline of the second bitline pair, and a fourth transistor coupled between the reference bitline of the second bitline pair and the second node, the fourth transistor configured to form a current path in response to a voltage at the main bitline of the first bitline pair.

The isolation circuit may further include a fifth transistor coupled between the main bitline of the first bitline pair and a third node, the fifth transistor configured to form a current path in response to the voltage at the reference bitline of the second bitline pair, and a sixth transistor coupled between the reference bitline of the first bitline pair and the third node, the sixth transistor configured to form a current path in response to a voltage at the main bitline of the second bitline pair.

The isolation circuit may further include a seventh transistor connected to the third node, the seventh transistor configured to provide the second voltage level to the main bitline of the first bitline pair or the reference bitline of the first bitline pair.

At least one of the above and other features and advantages may also be realized by providing a data readout method of a semiconductor memory device, the method including connecting a bitline of a first bitline pair to a memory cell, the first bitline pair being charged to a first voltage level, connecting the first bitline pair to a second bitline pair charged to a second voltage level differing from the first voltage level, and sensing the second bitline pair after isolating one of the connections between the first bitline pair and the second bitline pair.

The data readout method may further include charging the first bitline pair and the second bitline pair to the first voltage level and the second voltage level, respectively.

A bitline of the first bitline pair unconnected to the memory cell may be isolated from a corresponding bitline of the second bitline pair when an amount of charges stored in the memory cell is smaller than that of charges stored in the bitline of the first bitline pair connected to the memory cell.

A bitline of the first bitline pair connected to the memory cell may be isolated from a corresponding bitline of the second bitline pair when a amount of charges stored in the memory cell is greater than that of charges stored in the bitline connected to the memory cell.

One of connections between the first bitline pair and the second bitline pair may be isolated while a difference between voltages of the second bitline pair is amplified.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2009-0093751, filed on Oct. 1, 2009, in the Korean Intellectual Property Office, and entitled: "Semiconductor Memory Device and Data Read Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout.

For the convenience of description, a memory device according to embodiments will be described in the context of a dynamic random access memory (DRAM). However, it will be appreciated that the memory device is not limited to the DRAM.

Figure 1:
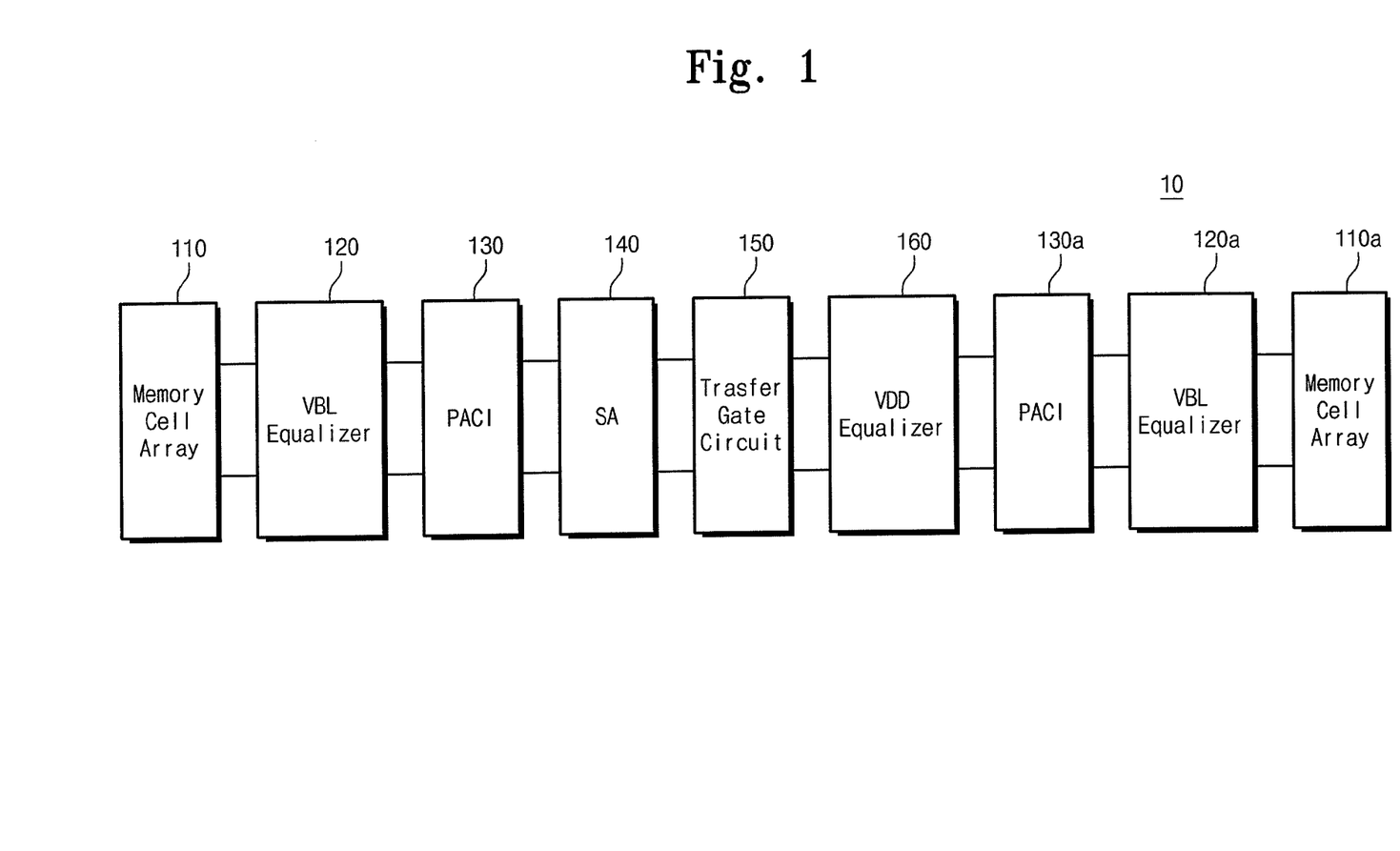
FIG. 1 illustrates a block diagram of a sensing and equalizing circuit of sense amplifier sharing type according to an embodiment.

FIG. 1 illustrates a block diagram of a sensing and equalizing circuit 10 of a sharing type sense amplifier according to an embodiment. Referring to FIG. 1, the sensing and equalizing circuit 10 may be coupled to memory cell arrays 110 and 110a. The sensing and equalizing circuit 10 may include one or more VBL equalizer circuits 120 and 120a, one or more pre-sensing and charge isolation circuits (PACI) 130 and 130a, a sense amplifier (SA) 140, a transfer gate circuit 150, and a VDD equalizer circuit 160.

Each of the memory cell arrays 110 and 110a may share the sense amplifier 140, the transfer gate circuit 150, and the VDD equalizer circuit 160. Thus, when one of the cell arrays 110 and 110a is selected, the pre-sensing and isolation circuits 130 and 130a may isolate the other memory cell array. For the convenience of description, the sense amplifier 140, the transfer gate circuit 150, and the VDD equalizer circuit 160 may be jointly referred to as a sensing block.

When data written into the memory cell array 110 is read out, the pre-sensing and isolation circuit 130 may connect the memory cell array 110 to the sensing block through a bitline. The pre-sensing and isolation circuit 130a may isolate the memory cell array 110a from the sensing block.

The structure and operation of the sensing and equalizing circuit 10 according to the present embodiment will now be described below with reference to FIG. 2. For the convenience of description, it is assumed that a memory cell array 110a is isolated by the pre-sensing and isolation circuit 130a.

Figure 2:
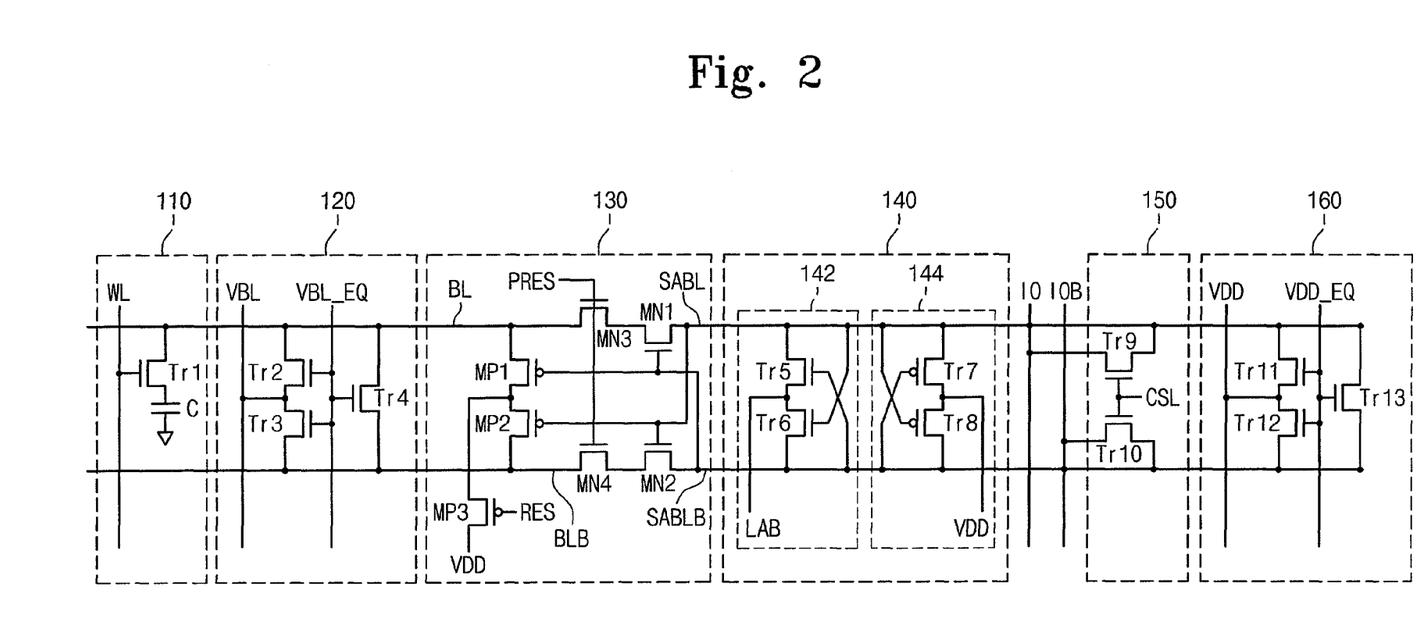
FIG. 2 illustrates details of an example circuit diagram of the sensing and equalizing circuit of FIG. 1.

FIG. 2 illustrates details of an example circuit diagram of the sensing and equalizing circuit 10 of FIG. 1. The sensing and equalizing circuit 10 may be coupled to the memory cell array 110. The sensing and equalizing circuit 10 may include the VBL equalizer circuit 120, the pre-sensing and isolation circuit (PACT) 130, the sense amplifier (SA) 140, the transfer gate circuit 150, and the VDD equalizer circuit 160.

The memory cell array 110 and the VBL equalizer circuit 120 may be connected to the pre-sensing and isolation circuit 130 through a bitline pair (BL and BLB). The sense amplifier 140, the transfer gate circuit 150, and the VDD equalizer circuit 160 may be connected to the pre-sensing and isolation circuit 130 through a sensing bitline pair SABL and SABLB (SABL bar).

The memory cell array 110 may include a plurality of memory cells. For convenience of description, only one memory cell is shown in FIG. 2. Each memory cell may be disposed at an intersection of a wordline WL and a bitline BL. Each memory cell may include a capacitor and a transistor disposed at an intersection of a wordline WL and a bitline BL, although memory cells having other structures may be used.

The VBL equalizer circuit 120 may include a plurality of NMOS transistors. In the example shown in FIG. 2, the VBL equalizer circuit 120 is configured to precharge and equalize the bitline pair (BL and BLB) to a VBL level when a VBL equalizing signal VBL_EQ is enabled.

The pre-sensing and isolation circuit 130 may include a plurality of NMOS transistors and a plurality of PMOS transistors. For example, referring to FIG. 2, the pre-sensing and isolation circuit 130 may include first to fourth NMOS transistors MN1~MN4 and first to third PMOS transistors MP1~MP3. In the example shown in FIG. 2, the first NMOS transistor MN1 or the second NMOS transistor MN2 isolates one of the bitline pairs (BL and BLB) and the sensing bitline pair (SABL and SABLB) during a sensing operation. In addition, the first NMOS transistor MN1 or the second NMOS transistor MN2 discharges one of connections of the bitline pairs (BL and BLB) and the sensing bitline pair (SABL and SABLB) to a ground level (0V) during the sensing operation. When the sensing bitline SABL is low and the complementary sensing bitline SABLB is high, the second NMOS transistor MN2 may be turned off to isolate the connection of the complementary bitline BLB and the complementary sensing bitline SABLB. At this point, the first NMOS transistor MN1 may be turned on and a voltage level of the bitline BL and the sensing bitline SABL may be discharged to the ground level (0V).

In the example shown in FIG. 2, the third and fourth NMOS transistors MN3 and MN4 are turned off to isolate the bitline pair (BL and BLB) and the sensing bitline pair (SABL and SABLB). Thus, the third and fourth transistors MN3 and MN4 isolate the memory cell array 110 and a sensing block. In the example shown in FIG. 2, the third and fourth NMOS transistors MN3 and MN4 are turned on to connect the bitline pair (BL and BLB) with the sensing bitline pair (SABL and SABLB). In this case, the third and fourth NMOS transistors MN3 and MN4 may cause a pre-sensing operation. For instance, when the bitline pair (BL and BLB) with the sensing bitline pair (SABL and SABLB) are precharged to different voltage level respectively, the third and fourth NMOS transistors MN3 and MN4 may be turned on to perform the pre-sensing operation.

In the example shown in FIG. 2, the first to third PMOS transistors MP1~MP3 allow one of the bitline pair (BL and BLB) to rise to a VDD level during a restore operation or a write operation. For example, when a restore operation is performed following a sensing operation, the first to third PMOS transistors MP1~MP3 allow a bitline of the VBL level to change to a VDD level.

In the example shown in FIG. 2, the sense amplifier 140 includes an N-latch circuit 142 comprising NMOS transistors Tr5 and Tr6 and a P-latch circuit 144 comprising PMOS transistors Tr7 and Tr8. The N-latch circuit 142 connects a low-voltage line of the sensing bitline (SABL and SABLB) to the ground level (0V) during a sensing operation. The P-latch circuit 144 allows a high-voltage line of the sensing bitline pair (SABL and SABLB) to rise to the VDD level during the sensing operation. A power supply voltage VDD is applied to the P-latch circuit 144 as a well-bias voltage.

In the example shown in FIG. 2, the transfer gate circuit 150 includes a plurality of NMOS transistors, e.g., NMOS transistors Tr9 and Tr10. During a readout operation, the transfer gate circuit 150 transfers data received from the sense amplifier 140 to an external entity. During a write operation, the transfer gate circuit 150 provides externally received data to the sense amplifier 140. Transistors Tr9 and Tr10 may be controlled by a signal CSL applied to the gates thereof.

In the example shown in FIG. 2, the VDD equalizer circuit 160 includes a plurality of NMOS transistors, e.g., NMOS transistors Tr11, Tr12, and Tr13. The VDD equalizer circuit 160 precharges and equalizes the sensing bitline pair (SABL and SABLB) to the VDD level when a VDD equalizing signal VDD_EQ is enabled on the gates of the NMOS transistors Tr11, Tr12, and Tr13.

As set forth above, the sensing and equalizing circuit 10 may perform a pre-sensing operation during a readout operation. In this case, a voltage difference between a sensing bitline pair (SABL and SABLB) may be greater than that between a bitline pair (BL and BLB) Thus, the sensing and equalizing circuit 10 may perform a readout operation even at low VBL and VDD voltage levels. This will be described in further detail below with reference to FIGS. 3 and 6.

The pre-sensing and isolation circuit 130 may be configured to automatically isolate the connection between the memory cell array 110 and the sense amplifier 140 during a readout operation. Thus, the sensing and equalizing circuit 10 shown in FIG. 2 may minimize power consumed during the readout operation. This will be described in further detail below with reference to FIG. 3.

Additionally, the pre-sensing and isolation circuit 130 may automatically cut off transition of a voltage level of the bitline pair (BL and BLB) during a write operation. Thus, the sensing and equalizing circuit shown in FIG. 2 may minimize power consumed during the write operation. This will be described in further detail below with reference to FIG. 4.

Figure 3:
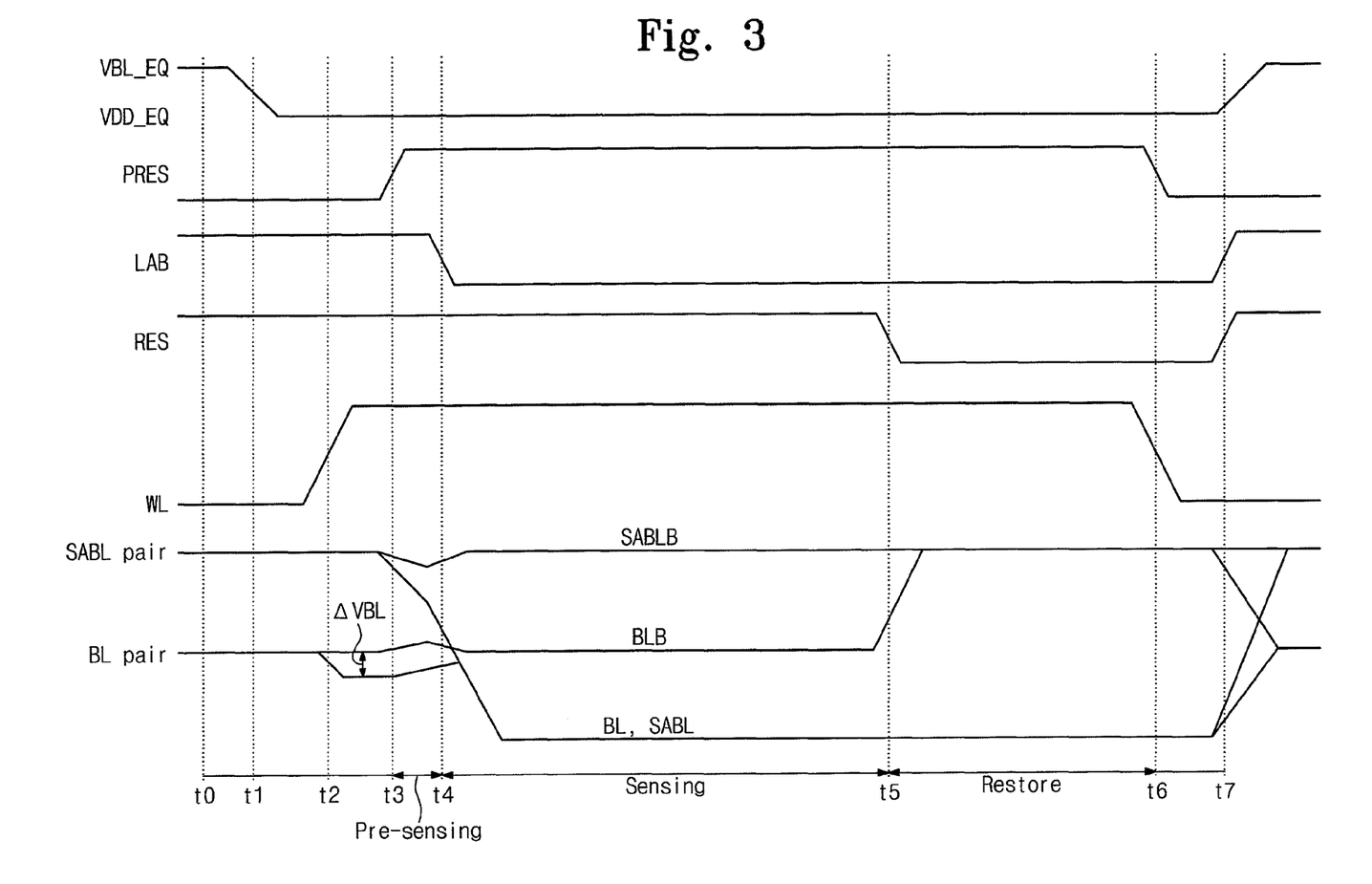
FIG. 3 illustrates a timing diagram of read and restore operations of the sensing and equalizing circuit of FIG. 2.

FIG. 3 illustrates a timing diagram of read and restore operations of the sensing and equalizing circuit 10 of FIG. 2.

For the brevity of description, it is assumed that a restore operation is performed after a readout operation is performed. It is assumed that the readout operation includes a charge sharing operation of a memory cell and a bitline BL, a pre-sensing operation, and a sensing operation.

At initial timing t0, a pre-sense (PRES) signal is in a low state. Accordingly, third and fourth NMOS transistors MN3 and MN4 are in an inactive state. Thus, a bitline pair (BL and BLB) and a sensing bitline pair (SABL and SABLB) are isolated, respectively. Also at the initial time t0, a VBL equalizing signal VBL_EQ and a VDD equalizing signal VDD_EQ are in a high state. Accordingly, the bitline pair (BL and BLB) and the sensing bitline pair (SABL and SABLB) may be precharged and equalized to a VBL level and a VDD level, respectively.

At first timing t1, the VBL equalizing signal VBL_EQ and the VDD equalizing signal VDD_EQ transition to a low state. Accordingly, the bitline pair (BL and BLB) and the sensing bitline pair (SABL and SABLB) are isolated from an external entity, i.e., are in a floating state, respectively.

At second timing t2, a wordline WL voltage transitions to a high state. That is, a wordline WL is selected by a row decoder (not shown) and the selected wordline WL transitions to a high state. Thus, charge sharing occurs between a charge stored in a memory cell connected to a selected wordline WL and a bitline BL.

For instance, it is assumed in FIG. 3 that data '0' is stored in a memory cell. That is, it is assumed that a level of charges stored in a memory cell is higher than that of charges stored in a bitline. In this case, a voltage of the bitline BL may decrease by ΔVBL due to the charge sharing between the charges stored in a memory cell and the charges stored in the bitline BL. On the other hand, a complementary bitline BLB may be maintained at a VBL voltage level.

Between third timing t3 and fourth timing t4, the PRES signal transitions to a high state and a pre-sensing operation is performed. More specifically, the PRES signal transitions to a high state to activate the third and fourth transistors MN3 and MN4. Thus, the bitline BL and the complementary bitline BLB are connected to the sensing bitline SABL and the complementary sensing bitline SABLB, respectively.

In this case, because voltage levels of the bitline BL and the sensing bitline SABL are different from each other, charge sharing occurs between the bitline BL and the sensing bitline SABL. Similarly, because voltage levels of the complementary bitline BLB and the complementary sensing bitline SABLB are different from each other, charge sharing occurs between the complementary bitline BLB and the complementary sensing bitline SABLB.

When charge sharing occurs, there is a voltage difference between the sensing bitline pairs (SABL and SABLB). This is because there is a voltage difference ΔVBL between the bitline BL connected to the sensing bitline SABL and the complementary bitline BLB connected to the complementary sensing bitline SABLB.

In addition, a voltage difference between the sensing bitline pair (SABL and SABLB) may be greater than that between the bitline pair (BL and BLB). This is because charge capacity of the sensing bitline SABL is lower than that of the bitline BL and that of a memory cell connected to the bitline BL.

For instance, in FIG. 3, a voltage level of the bitline BL is lower than that of the complementary bitline BLB. Accordingly, a voltage level of the sensing bitline SABLB may decrease faster than that of the complementary sensing bitline SABLB. Moreover, referring to the fourth timing t4 in FIG. 3, a voltage difference between the sensing bitline pair (SABL and SABLB) may be greater than that between the bitline pair (BL and BLB).

Between the fourth timing t4 and fifth timing t5, the sense amplifier 140 is activated to perform a sensing operation. That is, the sensing amplifier 140 amplifies the voltage difference between the sensing bitline SABL and the complementary sensing bitline SABLB. For instance, referring to FIG. 2, the N-latch circuit 142 may be driven to allow the voltage level of the sensing bitline SABL to turn to a VDD level.

As set forth above, according to the present embodiment, a voltage difference between the sensing bitline pair (SABL and SABLB) is greater than that between the bitline pair (BL and BLB). This is because one of the first and second NMOS transistors MN1 and MN2 is turned off to isolate one of the connections of the bitline pair (BL and BLB) and the sensing bitline pair (SABL and SABLB).

For instance, referring to FIGS. 2 and 3, the sensing bitline SABL and the complementary sensing bitline SABLB go to a ground level (0V) and a VDD level due to the sense amplifier 140, respectively. Thus, the first NMOS transistor MN1 is turned on to connect the bitline BL to the sensing bitline SABL while the second NMOS transistor MN2 is turned off to isolate the connection of the complementary bitline BLB from the complementary sensing bitline SABLB.

In this case, a voltage of the bitline BL and the sensing bitline SABL connected by the first NMOS transistor MN1 becomes a ground level (0V), and the connection of the complementary bitline BLB and the complementary sensing bitline SABLB is isolated by the second NMOS transistor MN2. Thus, the sensing and equalizing circuit 10 according to the embodiment may minimize power consumed during a sensing operation.

Between the fifth timing t5 and sixth timing t6, a restore operation is performed. That is, a restore (RES) signal transitions to a low state and the third PMOS transistor MP3 is activated. Accordingly, a VDD voltage is applied to a common node of the first and second PMOS transistors MP1 and MP2. Thus, of the bitline pair (BL and BLB), a high voltage line becomes a VDD level.

At the sixth timing t6, the PRES signal and the voltage of a wordline WL transition to the low state, respectively. Thus, the memory cell array 10 and the sensing block are isolated. In addition, data of a memory cell goes to a storage state.

At seventh timing t7, precharging and equalizing operations are performed to initiate the next readout or write operation.

As set forth above, the sensing and equalizing circuit according to an embodiment may perform a pre-sensing operation. Thus, even when low VBL and VDD voltage levels are applied, a readout operation may be normally performed. In addition, the sensing and equalizing circuit according to an embodiment may cut off one of the connections of the bitline pair (BL and BLB) and the sensing bitline pair (SABL and SABLB) during a sensing operation. Thus, power consumed during the sensing operation may be minimized.

It will be appreciated that the readout and restore operation of the sensing and equalizing circuit shown in FIG. 2 is merely an example. For instance, it will be appreciated that after a readout operation is performed, a write operation of other data may be performed, instead of a restore operation.

Figure 4:
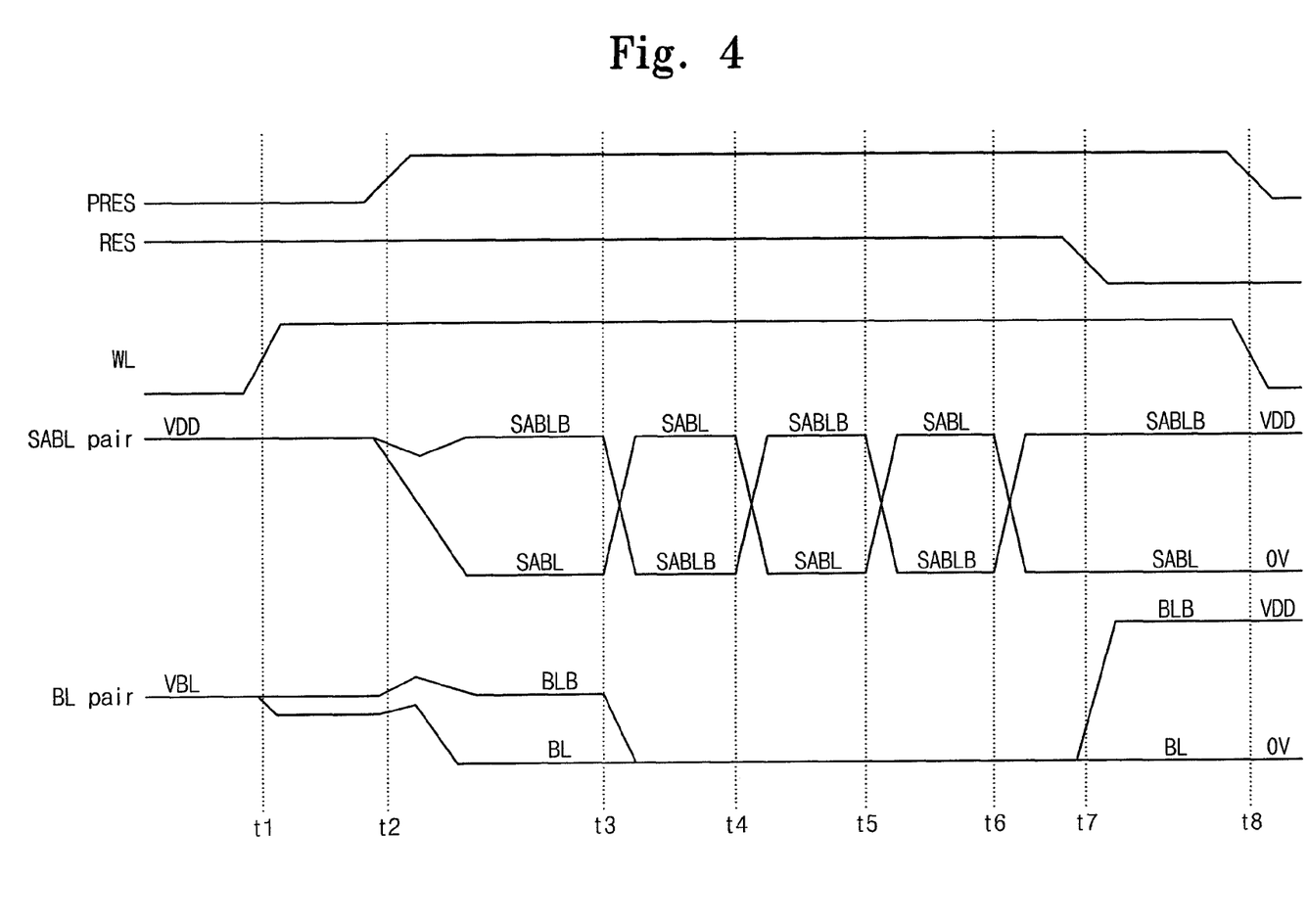
FIG. 4 illustrates a timing diagram of a write operation of the sensing and equalizing circuit of FIG. 2.

FIG. 4 illustrates a timing diagram of a write operation of the sensing and equalizing circuit 10 of FIG. 2.

For the brevity of description, it is assumed that data '0' is stored in a memory cell of the memory cell array 110. It is also assumed that, between third timing t3 to sixth timing t6, data '1, 0, 1, 0' are externally transferred to the sense amplifier 140. A write operation of the sensing and equalizing circuit shown in FIG. 2 will now be described below in detail with reference to FIGS. 2 and 4.

Between first timing t1 to third timing t3, the data stored in the memory cell of the memory cell array 110 is read out. That is, the sense amplifier 140 may sense the data stored in the memory cell. Since the data '0' is stored in the memory cell, the bitline BL and the sensing bitline SABL are in a low state. The complementary bitline BLB and the complementary sensing bitline SABLB have VBL and VDD voltage levels, respectively. Because the readout operation was described above in detail with reference to FIG. 3, the description will not be repeated in detail.

Between the third timing t3 and fourth timing t4, data '1' is transferred to the sense amplifier 140 through the transfer gate circuit 150. In this case, a voltage of the sensing bitline pair (SABL and SABLB) is inverted by a voltage of a data input/output line pair (IO and IOB (IO bar)). Thus, the bitline BL and the sensing bitline SABL are isolated from each other. As a result, the bitline BL has a voltage level of a low state that is a previous voltage level.

Since the sensing bitline SABL is in a high state, the second NMOS transistor MN2 is turned on to connect the complementary bitline BLB and the complementary sensing bitline SABLB to each other. Thus, a voltage level of the complementary bitline BLB transitions to a low state that is a voltage level of the complementary sensing bitline SABLB.

Between the fourth timing t4 and fifth timing t5, the data '0' is transferred to the sense amplifier 140 through the transfer gate circuit 150. In this case, a voltage of the sensing bitline pair (SABL and SABLB) is re-inverted. Thus, the sensing bitline SABL becomes a low state and the complementary sensing bitline SABLB becomes a high state.

In this case, a voltage level of the bitline pair (BL and BLB) is maintained at the low state. More specifically, since the sensing bitline SABL is in a low state, the second NMOS transistor MN2 is turned off to isolate the complementary bitline BLB and the complementary sensing bitline SABLB from each other. Thus, the bitline BL becomes a low state that is a voltage level of the sensing bitline SABL. As a result, the voltage level of the bitline BL is maintained at the low state.

Between the fifth timing f5 and sixth timing t6, data '1' is transferred to the sense amplifier 140. Between the sixth timing t6 and seventh timing t7, the data '0' is transferred to the sense amplifier 140. In this case, as set forth above, the voltage of the sensing bitline pair (SABL and SABLB) continues to be inverted while the voltage of the bitline pair (BL and BLB) is maintained at the low state.

Between the seventh timing t7 and eighth timing t8, the data transferred to the sensing bitline pair (SABL and SABLB) is stored in a memory cell. When there is an external requirement for storage of the data, the RES signal transitions to a low level. Thus, the VDD voltage is applied to a common terminal of the first PMOS transistor MP1 and the second PMOS transistor MP2. As a result, the voltage of the complementary bitline BLB rises to the VDD voltage level and the data is written into the memory cell.

As set forth above, the pre-sensing and isolation circuit 130 according to the present embodiment automatically cuts off the transition of the bitline pair (BL and BLB). Accordingly, externally transferred data is not automatically stored in a memory cell, which means that a user may selectively store desired data in a memory cell. For instance, as described in FIG. 4, a user may store data transferred to the sense amplifier 140 at desired timing t7. Moreover, when data are successively transferred from an external entity, the transition of the bitline pair (BL and BLB) may be automatically isolated to reduce current consumed during a write operation.

Figure 5:
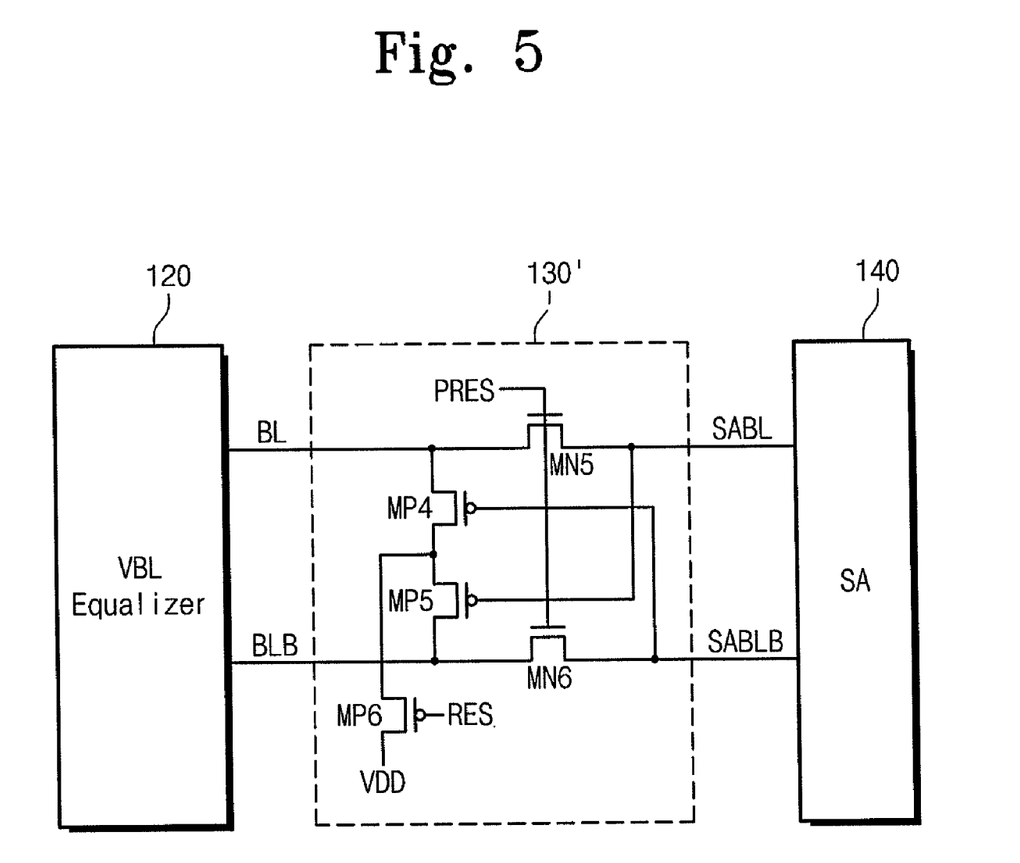
FIG. 5 illustrates a diagram of a pre-sensing and isolation circuit.

FIG. 5 illustrates a diagram of a pre-sensing and isolation circuit 130'. Referring to FIG. 5, the pre-sensing and isolation circuit 130' may include fifth and sixth NMOS transistors MN5 and MN6. The pre-sensing and isolation circuit 130' may also include fourth to sixth PMOS transistors MP4~MP6. The pre-sensing and isolation circuit 130' in FIG. 5 is similar to that in FIG. 2, except for the first and second NMOS transistors MN1 and MN2 included in the pre-sensing and isolation circuit 130 in FIG. 2. Differences between the pre-sensing and isolation circuits in FIGS. 2 and 5 will be particularly described below with reference to FIG. 6.

Figure 6:
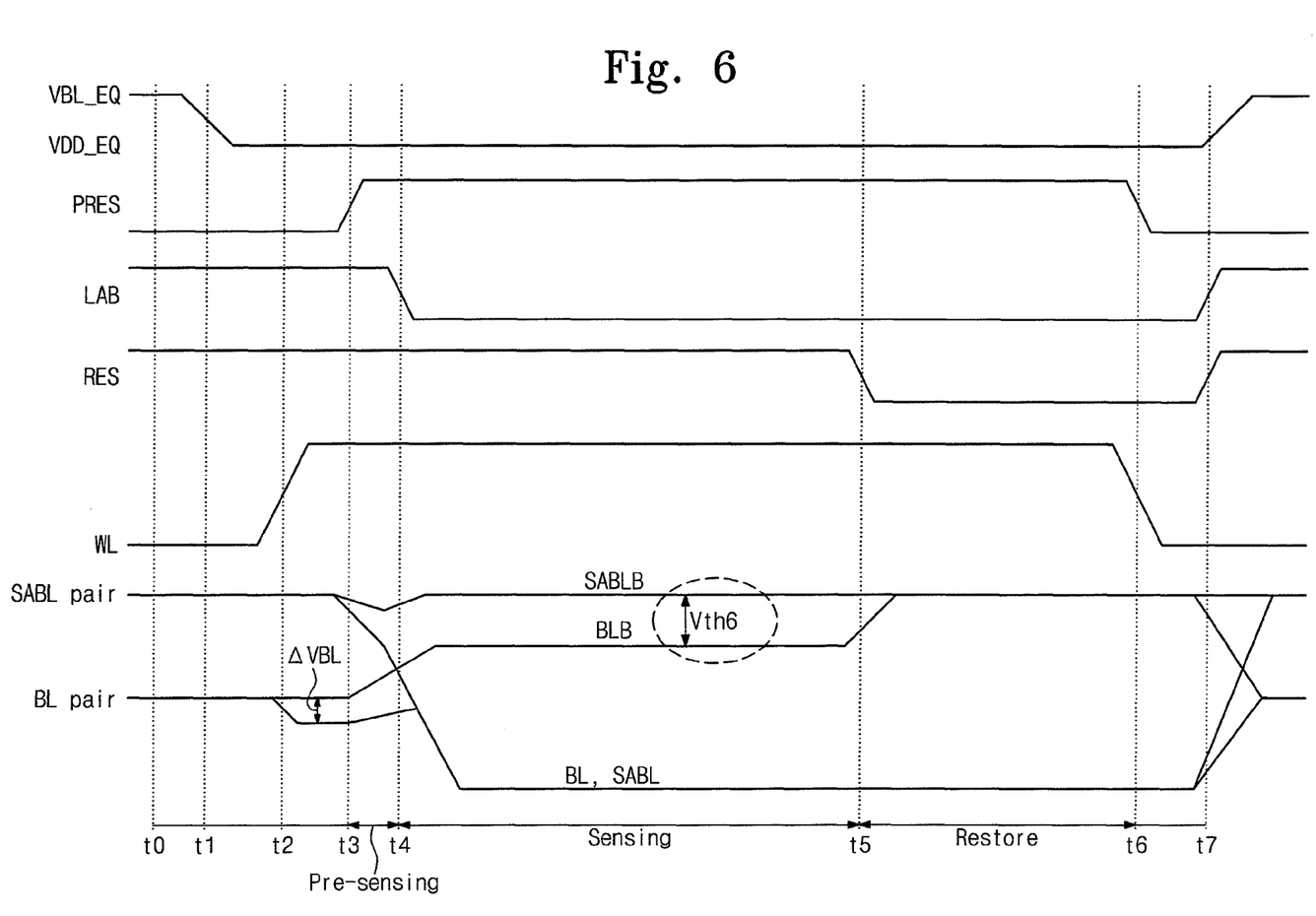
FIG. 6 illustrates a timing diagram of the pre-sensing and isolation circuit of FIG. 5.

FIG. 6 illustrates a timing diagram of the pre-sensing and isolation circuit 130' of FIG. 5.

Between initial timing t0 to third timing t3, charge sharing of the memory cell and the bitline BL occurs. The charge sharing is similar to that described in connection with FIG. 2 and will not explained again in detail.

Between the third timing t3 and fourth timing t4, a pre-sensing operation is performed. That is, the PRES signal transitions to a high state. Thus, charge sharing occurs between the bitline pair (BL and BLB) and the sensing bitline pair (SABL and SABLB).

Between the fourth timing t4 and fifth timing t5, a sensing operation is performed. That is, the sense amplifier 140 is activated to amplify a difference between voltages of the sensing bitline pair (SABL and SABLB).

In this case, the sense amplifier 140 may perform a sensing operation even at low VBL and VDD voltage levels, because a voltage difference between the sensing bitline pair (SABL and SABLB) is greater than that between the bitline pair (BL and BLB). This was described above with reference to FIG. 3 and will not be described again in detail.

Unlike the pre-sensing and isolation circuit 130 in FIG. 2, a voltage of the complementary bitline BLB is not maintained at a regular level, because the pre-sensing and isolation circuit 130' in FIG. 5 does not include the first and second NMOS transistors MN1, MN2 included in the pre-sensing and isolation circuit 130 in FIG. 2. Thus, the complementary bitline BLB has a voltage level obtained by subtracting a threshold voltage Vth6 of the sixth NMOS transistor MN6 from VDD.

Between the fifth timing t5 and the sixth timing t6, a restore operation is performed. The restore operation is similar to that described in connection with FIG. 2 and will not be described again in detail.

Figure 7:
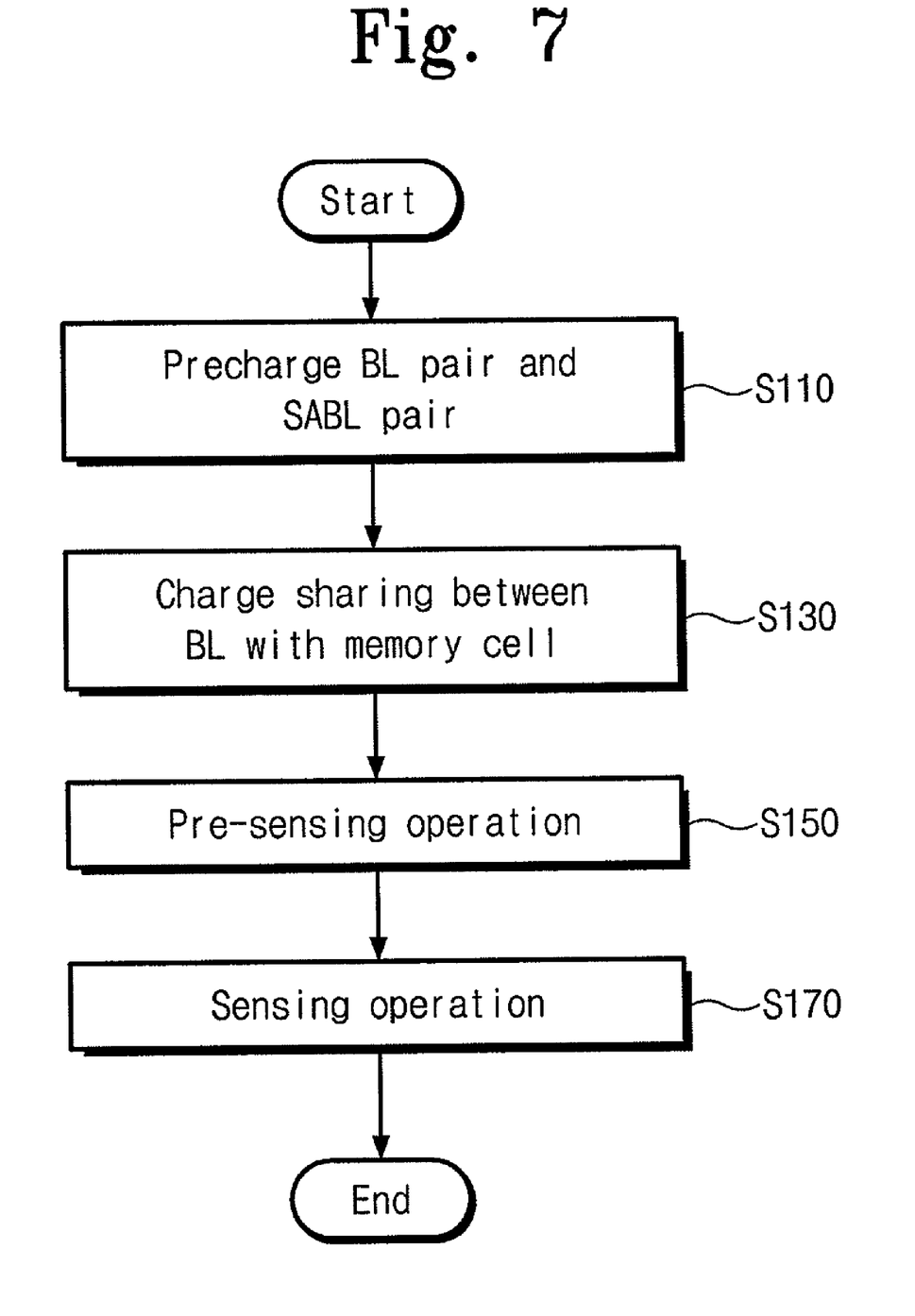
FIG. 7 illustrates a flowchart of a readout operation of a sensing and equalizing circuit according to an embodiment.

FIG. 7 illustrates a flowchart of a readout operation of a sensing and equalizing circuit according to an embodiment. In FIG. 7, the operation of the sensing and equalizing circuit will be described below with reference to FIGS. 1 to 6.

Referring to FIG. 7, at S110, the bitline pair (BL and BLB) and the sensing bitline pair (SABL and SABLB) are precharged to the VBL level and the VDD level, respectively. In this case, the PRES signal is maintained at the low state. Thus, the third and fourth NMOS transistors MN3 and MN4 are turned off, and the bitline pair (BL and BLB) and the sensing bitline pair (SABL and SABLB) are isolated from each other. As a result, the bitline pair (BL and BLB) and the sensing bitline pair (SABL and SABLB) may be precharged to different voltage levels, respectively.

At S130, charge sharing occurs between the bitline BL and the memory cell. That is, the wordline WL is selected by a row decoder and a voltage of the selected wordline WL transitions to a high state. Thus, charge sharing occurs between charges stored in a capacitor of a memory cell and charges of the bitline BL.

For instance, when the number of charges stored in a memory cell is smaller than that of charges of the bitline BL, a voltage level may fall. In this case, a difference between voltages of the bitline BL and the complementary bitline BLB may be denoted as ΔVBL.

At S150, a pre-sensing operation is performed. That is, the PRES signal may transition to a high state and the bitline pair (BL and BLB) and the sensing bitline pair (SABL and SABLB) may be connected, respectively. In this case, charge sharing may occur between the bitline BL and the sensing bitline SABL. Similarly, charge sharing may also occur between the complementary bitline BLB and the complementary sensing bitline SABLB.

For instance, when a voltage of the bitline BL is lower than that of the complementary bitline BLB, a voltage of the sensing bitline SABL may decrease faster than that of the complementary sensing bitline SABLB. In addition, a difference between voltages of the sensing bitline SABL and the complementary sensing bitline SABLB may be greater than that between voltages of the bitline BL and the complementary bitline BLB.

At S170, a sensing operation may be performed. That is, the sense amplifier 140 may be activated to sense and amplify the difference between voltages of the sensing bitline SABL and the complementary sensing bitline SABLB.

According to example embodiments described herein, the difference between voltages of the sensing bitline SABL and the complementary sensing bitline SABLB may be greater than the difference between voltages of the bitline BL and the complementary bitline BLB. Thus, a sensing and equalizing circuit according to embodiments may perform a sensing operation even at low VBL and VDD levels.

In case of the sensing and equalizing circuit in FIG. 2, one of the third and fourth NMOS transistors MN3 and MN4 may be turned off when a sensing operation is performed. Thus, the sensing and equalizing circuit in FIG. 2 may decrease power consumed during a readout operation.

The above-mentioned VBL and VDD voltage levels may be variously defined. For instance, the VDD voltage level may have the maximum voltage level given by an Equation 1 as follows:

$$VDD = VBL + Vth1,3 + Vth2,4 + 2\Delta VBL$$ [Equation 1]

wherein Vth1,3 represents a threshold voltage of the first NMOS transistor MN1 or the third NMOS transistor MN3, Vth2,4 represents a threshold voltage of the second NMOS transistor MN2 or the fourth NMOS transistor MN4, and ΔVBL represents a difference between voltages of the bitline pair (BL and BLB).

According to a result of a test, a readout operation and a write operation was normally performed when VDD was about 0.6 volt, VBL was about 0.3 volt, and a temperature was −55 degrees centigrade.

Figure 8:
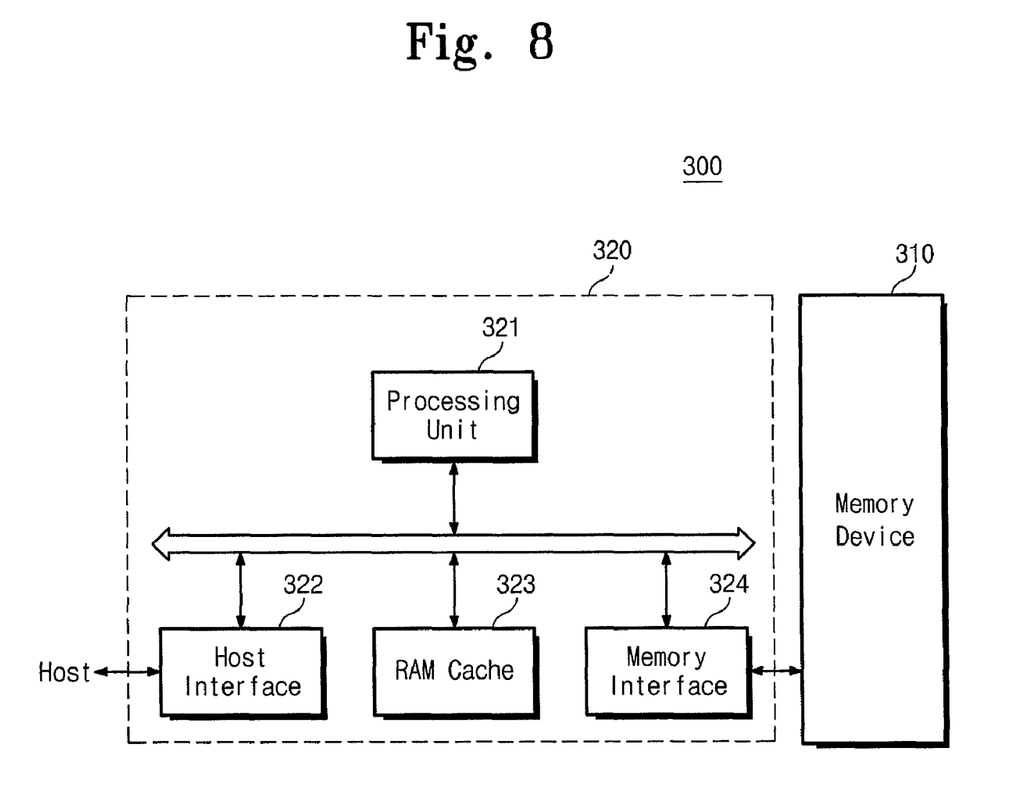
FIG. 8 illustrates a block diagram of a memory system according to an embodiment.

FIG. 8 illustrates a block diagram of a memory system 300 according to an embodiment. As illustrated, the memory system 300 includes a memory device 310 and a controller 320.

The controller 320 is connected to a host and the memory device 310. The controller 310 transfers data read from the memory device 320 to the host and stores data transferred from the host in the memory device 310.

The controller 320 may include well-known components such as a processing unit 321, a host interface 322, a RAM 323, and a memory interface 324. The processing unit 321 controls the entire operation of the controller 320. The host interface 322 may include a protocol for data exchange between the host and the controller 320. For example, the controller 320 may be configured to communicate with an external entity (host) through one of various interface protocols, such as USB, MMC, PCI-E, Advanced Technology Attachment (ATA), Serial-ATA, Parallel-ATA, SCSI, ESDI, and Integrated Drive Electronics (IDE). The RAM 323 is used as a working memory of the processing unit 321. The memory interface 324 interfaces with the memory device 310. The controller 320 may further include an error correction code block (ECC). The ECC detects and corrects error of data read from the memory device 310.

The memory device 310 stores data in compliance with control of the controller 320. The memory device 310 according to the embodiment may be implemented in various forms. For instance, it will be understood that the memory device 310 may be implemented with volatile memory devices such as SRAM, DRAM, and SDRAM and nonvolatile memory devices such as ROM, PROM, EPROM, EEPROM, flash memory devices, PRAM, MRAM, RRAM, and FRAM.

The controller 320 and the memory device 310 may be integrated into a single semiconductor device. For instance, the controller 320 and the memory device 310 may be integrated into a single semiconductor device to constitute a memory card. For instance, the controller 320 and the memory device 310 may be integrated into a single semiconductor device to constitute a PC card (PCMCIA), a compact flash card (CF), a smart media card (SM/SMC), a memory stick, a multimedia card (MMC, RS-MMC, MMCmicro), an SD card (SD, miniSD, microSD), or an universal flash storage (UFS).

As another example, the controller 320 and the memory device 310 may be integrated into a single memory device to constitute a solid state disk/drive (SSD). When the memory system 300 is used as a semiconductor disk (SSD), the operation speed of the host connected to the memory system 300 may be remarkably improved.

As another example, the memory system 300 may be applied to a PDA, a portable computer, a web tablet, a wireless phone, a mobile phone, a digital music player, or devices capable of transmitting/receiving data in a wireless environment.

Figure 9:
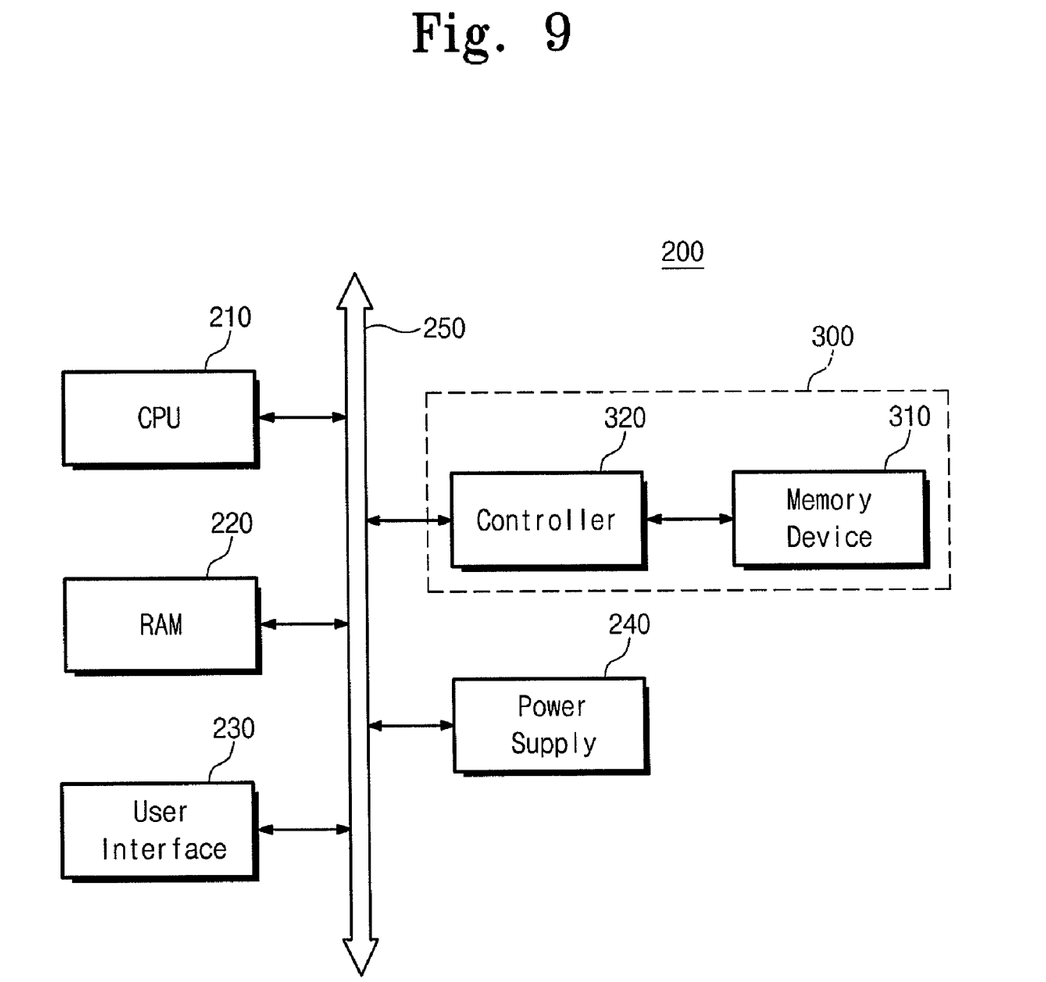
FIG. 9 illustrates a block diagram of a computing system including the memory system shown in FIG. 8.

FIG. 9 illustrates a block diagram of a computing system 200 including the memory system 300 shown in FIG. 8. As illustrated, the computing system 200 according to the embodiment includes a central processing unit (CPU) 210, a random access memory (RAM) 220, a user interface 230, a power supply 240, and the memory system 300.

The memory system 300 is electrically connected to the central processing unit 210, the RAM 220, the user interface 230, and the power supply 240 through a system bus 250. Data provided through the user interface 230 or processed by the central processing unit 210 are stored in the memory system 300. The memory system 300 includes the controller 320 and the nonvolatile memory device 310.

Although the memory device 310 constitutes the memory system 300 with the controller 320 and is connected to the system bus 250, embodiments are not limited thereto. For instance, it will be understood that the memory device (310 in FIG. 4) may also be provided as the RAM 220 of the computing system 200.

As described above, an example embodiment provides a semiconductor memory device including a first bitline pair equalized to a first voltage level by a first equalizer circuit, a second bitline pair equalized to a first voltage level by a second equalizer circuit, a pre-sensing and isolation circuit disposed between the first bitline pair and the second bitline pair and configured to electrically connect or isolate the first bitline pair to or from the second bitline pair, and a sense amplifier electrically connected to the second bitline and configured to sense and amplify a voltage difference of the second bitline pair. The pre-sensing and isolation circuit isolates one of the connections between the first bitline pair and the second bitline pair while the sense amplifier works.

According to the embodiments described above, a bitline pair and a sensing bitline pair may be equalized to different voltage levels, respectively. When a readout operation is performed, the bitline pair and the sensing bitline pair are electrically connected to each other. Thus, the readout operation may be normally performed even at a low equalizing voltage level.

In contrast, when a readout operation is performed in a general DRAM, a sense amplifier senses and amplifies a difference between respective voltages on the bitline BL and the complementary bitline BLB, and, when the level of an equalizing voltage provided to the bitline BL and the complementary bitline BLB is low, the bitline BL and the complementary bitline BLB may not have enough of a voltage difference to perform a readout operation.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
a first bitline pair equalized to a first voltage level by a first equalizer circuit;
a second bitline pair equalized to a second voltage level by a second equalizer circuit;
an isolation circuit disposed between the first bitline pair and the second bitline pair, the isolation unit configured to electrically connect or isolate the first bitline pair to or from the second bitline pair; and
a sense amplifier electrically connected to the second bitline pair, the sense amplifier configured to sense a voltage difference of the second bitline pair,
wherein the isolation circuit isolates one of the connections between the first bitline pair and the second bitline pair while the sense amplifier senses the voltage difference of the second bitline pair.

2. The semiconductor memory device as claimed in claim 1, wherein the isolation circuit electrically connects the first bitline pair to the second bitline pair before the sense amplifier senses the voltage difference of the second bitline pair.

3. The semiconductor memory device as claimed in claim 1, wherein the isolation circuit includes:
a first circuit unit coupled to the first bitline pair, the first circuit unit configured to electrically connect or isolate the first bitline pair to or from the second bit line pair; and
a second circuit unit coupled to the second bitline pair, the second circuit unit configured to electrically connect or isolate the first bitline pair to or from the second bitline pair,
wherein, before the sense amplifier senses the voltage difference of the second bitline pair, the first circuit unit and the second circuit unit electrically connect the first bitline pair to the second bitline pair.

4. The semiconductor memory device as claimed in claim 3, wherein, while the sense amplifier senses the voltage difference of the second bitline pair, the second circuit unit isolates one of the connections of the first bitline pair and the second bitline pair.

5. The semiconductor memory device as claimed in claim 4, wherein the first circuit unit comprises:
a first transistor coupled a main bitline of the first bitline pair, the first transistor configured to form a current path in response to a pre-sensing signal; and
a second transistor coupled a reference bitline of the first bitline pair, the second transistor configured to form a current path in response to the pre-sensing signal.

6. The semiconductor memory device as claimed in claim 5, wherein the second circuit unit comprises:
a third transistor coupled to a main bitline of the second bitline pair, the third transistor configured to form a current path in response to a voltage at a reference bitline of the second bitline pair; and
a fourth transistor coupled to the reference bitline of the second bitline pair, the fourth transistor configured to form a current path in response to a voltage at the main bitline of the second bitline pair.

7. The semiconductor memory device as claimed in claim 4, wherein, while the sense amplifier senses the voltage difference of the second bitline pair, a connected bitline of the first bitline pair and the second bitline pair has a ground voltage level.

8. The semiconductor memory device as claimed in claim 3, wherein the isolation circuit further comprises a third circuit unit connected to the first bitline pair, the third circuit unit configured to provide the second voltage level to the first bitline pair.

9. The semiconductor memory device as claimed in claim 8, wherein, during a restore operation, the third circuit unit provides the second voltage level to a bitline of the first bitline pair isolated by the second circuit unit.

10. The semiconductor memory device as claimed in claim 8, wherein the third circuit unit comprises:
a fifth transistor coupled between a main bitline of the first bitline pair and a node, the fifth transistor configured to form a current path in response to a voltage at a reference bitline of the second bitline pair;
a sixth transistor coupled between a reference bitline of the first bitline pair and the node, the sixth transistor configured to form a current path in response to a voltage at a main bitline of the second bitline pair; and
a seventh transistor connected to the node and configured to provide the second voltage level to the main bitline of the first bitline pair or the reference bitline of the first bitline pair.

11. A sensing and equalizing circuit configured to sense a voltage difference of a bitline pair to read out data, the sensing and equalizing circuit comprising:
a first bitline pair equalized to a first voltage level by a first equalizer circuit;
a second bitline pair equalized to a second voltage level by a second equalizer circuit;
an isolation circuit disposed between the first bitline pair and the second bitline pair, the isolation circuit configured to electrically connect or isolate the first bitline pair to or from the second bitline pair; and
a sense amplifier electrically connected to the second bitline, the sense amplifier configured to sense a voltage difference of the second bitline pair,
wherein the isolation circuit includes:
a first transistor coupled between a main bitline of the first bitline pair and a first node, the first transistor configured to form a current path in response to a pre-sensing signal;
a second transistor coupled between a reference bitline of the first bitline pair and a second node, the second transistor configured to form a current path in response to the pre-sensing signal;
a third transistor coupled between a main bitline of the second bitline pair and the first node, the third transistor configured to form a current path in response to a voltage at a reference bitline of the second bitline pair; and
a fourth transistor coupled between the reference bitline of the second bitline pair and the second node, the fourth transistor configured to form a current path in response to a voltage at the main bitline of the first bitline pair.

12. The sensing and equalizing circuit as claimed in claim 11, wherein the isolation circuit further includes:
a fifth transistor coupled between the main bitline of the first bitline pair and a third node, the fifth transistor configured to form a current path in response to the voltage at the reference bitline of the second bitline pair; and
a sixth transistor coupled between the reference bitline of the first bitline pair and the third node, the sixth transistor configured to form a current path in response to a voltage at the main bitline of the second bitline pair.

13. The sensing and equalizing circuit as claimed in claim 12, wherein the isolation circuit further comprises a seventh transistor connected to the third node, the seventh transistor configured to provide the second voltage level to the main bitline of the first bitline pair or the reference bitline of the first bitline pair.

14. A data readout method of a semiconductor memory device, the method comprising:
connecting a bitline of a first bitline pair to a memory cell, the first bitline pair being charged to a first voltage level;
connecting the first bitline pair to a second bitline pair charged to a second voltage level differing from the first voltage level; and
sensing the second bitline pair after isolating one of the connections between the first bitline pair and the second bitline pair.

15. The data readout method as claimed in claim 14, further comprising charging the first bitline pair and the second bitline pair to the first voltage level and the second voltage level, respectively.

16. The data readout method as claimed in claim 15, wherein a bitline of the first bitline pair unconnected to the memory cell is isolated from a corresponding bitline of the second bitline pair when an amount of charges stored in the memory cell is smaller than that of charges stored in the bitline of the first bitline pair connected to the memory cell.

17. The data readout method as claimed in claim 16, wherein a bitline of the first bitline pair connected to the memory cell is isolated from a corresponding bitline of the second bitline pair when a amount of charges stored in the memory cell is greater than that of charges stored in the bitline connected to the memory cell.

18. The data readout method as claimed in claim 17, wherein one of connections between the first bitline pair and the second bitline pair is isolated while a difference between voltages of the second bitline pair is amplified.

* * * * *